United States Patent
Yoshikawa

(10) Patent No.: US 12,061,130 B2
(45) Date of Patent: Aug. 13, 2024

(54) MANUFACTURING METHOD OF A SEMICONDUCTOR PRESSURE SENSOR HAVING FIRST SILICON AND SECOND SILICON SUBSTRATES INCLUDING AN OXIDE FILM

(71) Applicant: Mitsubishi Electric Corporation, Tokyo (JP)

(72) Inventor: Eiji Yoshikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 354 days.

(21) Appl. No.: 17/426,262

(22) PCT Filed: Jun. 28, 2019

(86) PCT No.: PCT/JP2019/025775
§ 371 (c)(1),
(2) Date: Jul. 28, 2021

(87) PCT Pub. No.: WO2020/217549
PCT Pub. Date: Oct. 29, 2020

(65) Prior Publication Data
US 2022/0099512 A1    Mar. 31, 2022

(30) Foreign Application Priority Data
Apr. 24, 2019   (JP) ................. 2019-082442

(51) Int. Cl.
*G01L 9/00*        (2006.01)
*H01L 23/544*      (2006.01)

(52) U.S. Cl.
CPC .......... *G01L 9/0042* (2013.01); *H01L 23/544* (2013.01)

(58) Field of Classification Search
None
See application file for complete search history.

(56) References Cited

U.S. PATENT DOCUMENTS 6,388,279 B1    5/2002  Sakai et al.
8,647,908 B2 *  2/2014  Yoshikawa ........... G01L 9/0048
                                              438/50

(Continued)

FOREIGN PATENT DOCUMENTS

CN    103091007 A    5/2013
JP    11-163371 A    6/1999

(Continued)

OTHER PUBLICATIONS

Korean Office Action issued Mar. 3, 2023 in Patent Application No. 10-2021-7032653.

(Continued)

*Primary Examiner* — Peter J Macchiarolo
*Assistant Examiner* — Jermaine L Jenkins
(74) *Attorney, Agent, or Firm* — Sughrue Mion, PLLC; Richard C. Turner

(57) ABSTRACT

The present application provides a semiconductor pressure sensor having high manufacturing stability and high accuracy. A second silicon substrate is bonded across an oxide film to one main face of a first silicon substrate, in which a recessed portion that becomes a reference pressure chamber and an alignment mark are formed, whereby the first silicon substrate and the second silicon substrate are joined in a state wherein the recessed portion and the alignment mark are covered by the second silicon substrate. The alignment mark is detected using an infrared sensor, positioning is carried out using the alignment mark, and a gauge resistor, which is a pressure-sensitive element portion, is formed in a diaphragm formed in the second silicon substrate positioned above the recessed portion.

1 Claim, 8 Drawing Sheets

(56) References Cited

U.S. PATENT DOCUMENTS

2013/0105922 A1    5/2013  Yoshikawa et al.
2019/0088493 A1    3/2019  Watanabe et al.

FOREIGN PATENT DOCUMENTS

| JP | 4250788 B2 | 4/2009 |
| JP | 2011-164057 A | 8/2011 |
| JP | 2014-052324 A | 3/2014 |
| JP | 5639985 B2 | 12/2014 |
| JP | 2015-194443 A | 11/2015 |
| JP | 2015194443 A * | 11/2015 |
| JP | 2019-054150 A | 4/2019 |

OTHER PUBLICATIONS

Notification of Reasons for Refusal dated Dec. 22, 2022 from the Chinese Patent Office in Application No. 201980095403.X.
Japanese Office Action for corresponding JP 2019-082442, dated Aug. 27, 2019.
Japanese Office Action for corresponding JP 2019-082442, dated Jan. 14, 2020.
International Search Report for PCT/JP2019/025775, dated Sep. 3, 2019.
Chinese Office Action issued Jul. 27, 2023 in Patent Application No. 201980095403.X.
Chinese Office Action dated Nov. 30, 2023 in Application No. 201980095403.X.

* cited by examiner

MANUFACTURING METHOD OF A SEMICONDUCTOR PRESSURE SENSOR HAVING FIRST SILICON AND SECOND SILICON SUBSTRATES INCLUDING AN OXIDE FILM

This application is a National Stage of International Application No. PCT/JP2019/025775 filed Jun. 28, 2019, claiming priority based on Japanese Patent Application No. 2019-082442 filed Apr. 24, 2019.

TECHNICAL FIELD

The present application relates to a semiconductor pressure sensor, and to a manufacturing method thereof.

BACKGROUND ART

There is a semiconductor pressure sensor of a configuration wherein a second substrate in which a pressure detecting portion is provided is bonded to a main face of a first substrate in which a recessed portion forming a reference pressure chamber is provided. An existing semiconductor pressure sensor is such that, for example, an alignment mark used for positioning when forming a pressure detecting portion is provided in a main face of a first substrate, and between an outer peripheral end of a second substrate and an outer peripheral end of the first substrate seen from a direction in which the first substrate and the second substrate are stacked, in an exposed state not covered by the second substrate (for example, refer to Patent Literature 1).

Also, technology such that a recessed portion forming the reference pressure chamber and a ores sure detecting portion such as a diaphragm are provided in one substrate, and an alignment mark is provided in such a way as to be in an exposed state on a surface of an insulating film on the substrate, is disclosed in another example (for example, refer to Patent Literature 2).

CITATION LIST

Patent Literature

Patent Literature 1: Japanese Patent No. 5,639,985
Patent Literature 2: Japanese Patent No. 4,250,788

SUMMARY OF INVENTION

Technical Problem

When existing technology is a configuration wherein a recessed portion forming a reference pressure chamber and a recessed portion forming an alignment mark are disposed in a main surface of a first substrate, the alignment mark is in an exposed state not covered by a second substrate. As the alignment mark is a recessed portion gouged out more shallowly than the recessed portion of the reference pressure chamber, there are cases wherein a foreign object such as a resist applied in a photoengraving process remains inside the recessed portion of the alignment mark, and there are cases wherein contamination caused by the foreign object occurs in a subsequent process, and product manufacturing stability decreases.

Also, an existing semiconductor pressure sensor is of a configuration wherein an alignment mark is provided in an outer peripheral portion of a first substrate that is not covered by a second substrate, meaning that when a large number of semiconductor pressure sensors are incorporated in a wafer that is the first substrate, positioning accuracy of an outer edge portion of the wafer is good owing to the outer edge portion being disposed in a vicinity of the alignment mark, but positioning accuracy of a central portion of the wafer, which is easily affected by wafer deformation, tends to be inferior due to the central portion being disposed far from the alignment mark, and there is a problem in that reliability decreases together with a decrease in product accuracy.

The present application, having been contrived in order to resolve the heretofore described kinds of problem, has an object of obtaining a semiconductor pressure sensor with high manufacturing stability and reliability by restricting contamination caused by a foreign object remaining in an alignment mark and by improving positioning accuracy, and of obtaining a manufacturing method of the semiconductor pressure sensor.

Solution to Problem

A semiconductor pressure sensor according to the present application includes a first silicon substrate in whose one main face a recessed portion, which becomes a reference pressure chamber, and an alignment mark are formed, a second silicon substrate that is joined to the one main face of the first silicon substrate across an oxide film and covers the recessed portion and the alignment mark, a pressure detecting portion including a diaphragm formed in the second silicon substrate positioned above the recessed portion and a pressure-sensitive element portion formed in the diaphragm.

Also, a semiconductor pressure sensor manufacturing method relating to the present application includes a step of forming a recessed portion, which becomes a reference pressure chamber, and an alignment mark in one main face of a first silicon substrate, a step of joining a second silicon substrate to the one main face of the first silicon substrate, and covering the recessed portion and the alignment mark with the second silicon substrate, a step of forming a diaphragm in the second silicon substrate, and a step of detecting the alignment mark using an infrared camera, and forming a pressure-sensitive element portion in the second silicon substrate after positioning using the alignment mark.

Advantageous Effects of Invention

According to the semiconductor pressure sensor of the present application, an alignment mark is covered by a second silicon substrate, and therefore not exposed, because of which contamination can be restricted even when a foreign object remains inside the alignment mark. Also, as the alignment mark can be disposed in an arbitrary position in the first silicon substrate covered by the second silicon substrate, tolerance when disposing the alignment mark is greater than when disposition of the alignment mark is limited to an outer edge portion of a wafer, positioning accuracy can be increased, and a semiconductor pressure sensor having high manufacturing stability and reliability can be obtained.

Also, according to the semiconductor pressure sensor manufacturing method of the present application, an alignment mark can be detected using an infrared sensor even when the alignment mark is in a state of being covered by a second silicon substrate, and positioning can be carried out using the alignment mark, because of which a semiconductor pressure sensor having high manufacturing stability and reliability can be obtained.

DESCRIPTION OF EMBODIMENTS

First Embodiment

Figure 1:
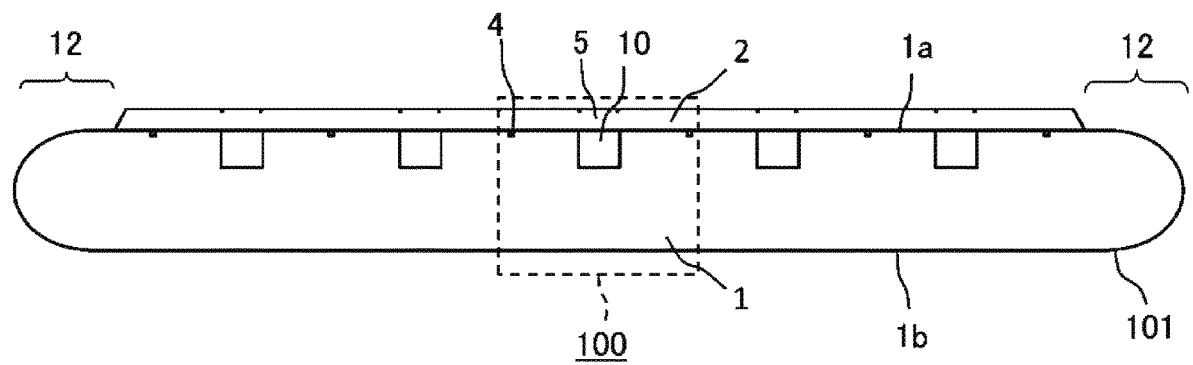
FIG. 1 is a sectional view showing a state wherein a semiconductor pressure sensor according to a first embodiment is formed in a wafer.
Figure 2:
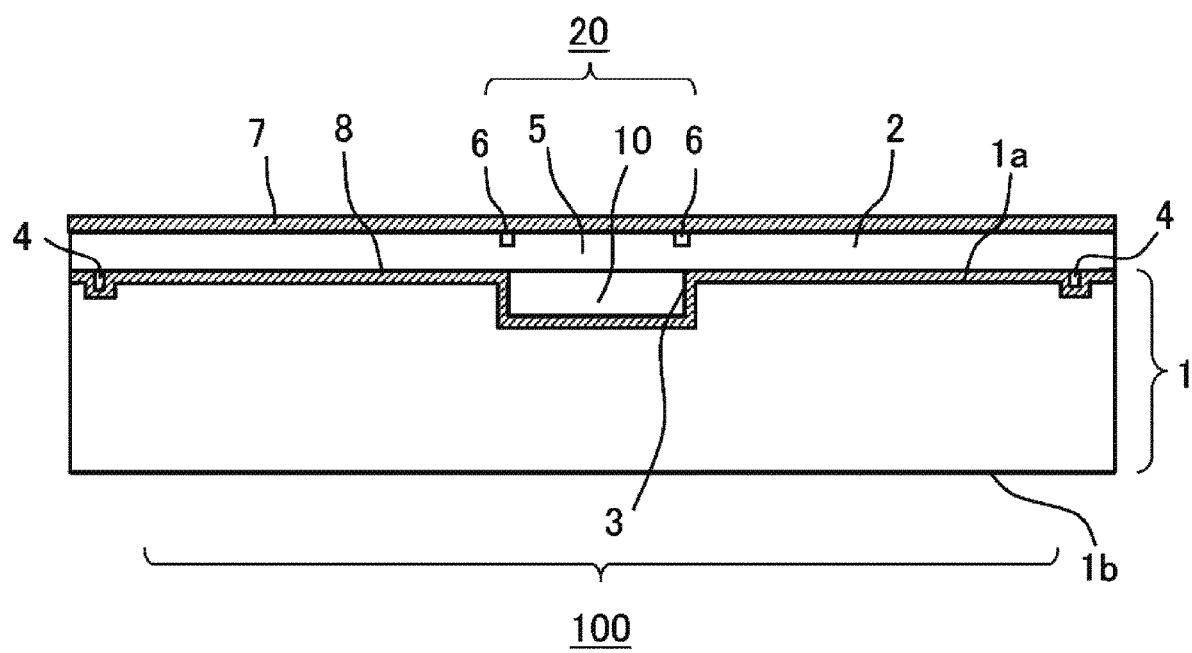
FIG. 2 is a main portion enlarged sectional view showing one semiconductor pressure sensor of FIG. 1.

A semiconductor pressure sensor 100 according to a first embodiment of the present application will be described, using FIG. 1 to FIG. 7. FIG. 1 is a sectional view of one wafer 101 in which a large number of the semiconductor pressure sensor 100 according to the first embodiment are incorporated, and shows a state in a stage before carrying out dicing wherein individual semiconductor pressure sensors 100 are cut away from the wafer 101. FIG. 2 is a main portion enlarged sectional view showing the semiconductor pressure sensor 100 of one chip provided in the wafer 101 of FIG. 1. Also, FIG. 3 to FIG. 7 are process drawings showing steps of manufacturing the semiconductor pressure sensor 100 of FIG. 2.

As shown in FIG. 1, a large number of the semiconductor pressure sensor 100 are incorporated in a flat face of the wafer 101 in the stage before dicing, and first silicon substrates 1 configuring one semiconductor pressure sensor 100 each are disposed in a matrix in one plane, forming one wafer 101 overall.

As shown in a cross-sectional structure of the wafer 101 of FIG. 1, an alignment mark 4 used when forming a pressure detecting portion 20 (shown in FIG. 2, to be described hereafter) is not disposed in a stepped portion 12 positioned in an outer edge portion of the wafer 101, but the alignment mark 4 is provided in a region of one main face 1a of the first silicon substrate 1 bonded to a second silicon substrate 2.

In an exceptional case wherein the alignment mark 4 is provided in an outer edge portion of the wafer 101, a quantity thereof is kept to a minimum, whereby a remaining of a foreign object inside the alignment mark 4, which is of a recessed form, is restricted.

As shown in FIG. 2, one semiconductor pressure sensor 100 is of a configuration wherein the first silicon substrate 1, in which a recessed portion 3 configuring a reference pressure chamber 10 and the alignment mark 4 are provided, and the second silicon substrate 2, in which a diaphragm 5 and a gauge resistor 6 are provided, are joined across an oxide film 8. The pressure detecting portion 20 is configured of pressure-sensitive element portions such as the reference pressure chamber 10, the diaphragm 5, and the gauge resistor 6.

Herein, the recessed portion 3 regulates an external form of the diaphragm 5 with a form of an end portion of an aperture portion of the recessed portion 3, and also regulates a capacity of the reference pressure chamber 10. A depth of the recessed portion 3 is typically provided in such a way as to be within a range of in the region of approximately 50 to 300 µm. The greater the depth of the recessed portion 3, which is gouged out from the one main face 1a of the first silicon substrate 1, the greater the capacity of the reference pressure chamber 10 that can be secured, and there is an advantage in that even when there is a slow leak or the like in the reference pressure chamber 10, pressure fluctuation can be reduced, and characteristic fluctuation can be reduced, but meanwhile a processing time becomes longer, and throughput decreases, because of which an appropriate value is selected from the typical range, and processing of the recessed portion 3 is carried out. The recessed portion 3 can be formed using a DRIE (deep reactive-ion etching) based on a Bosch process. According to a DRIE process based on the Bosch process, high-speed etching of the first silicon substrate 1 can be carried out vertically with respect to the one main face 1a, and a necessary capacity of the reference pressure chamber 10 can be secured without increasing a chip size of the semiconductor pressure sensor 100.

As heretofore described, the form of the diaphragm 5 is regulated by the form and a size of the end portion of the aperture portion of the recessed portion 3, because of which a form and a size of the recessed portion 3 provided in the one main face 1a of the first silicon substrate 1 are determined, with consideration to a thickness of the diaphragm 5, in such a way that pressure sensitivity characteristics, a breakdown voltage, and the like, expected of the semiconductor pressure sensor 100 are obtained.

For example, when a pressure to be measured is in the region of up to 4 atmospheres, the thickness of the diaphragm 5 can be set at 10 to 30 µm, and a planar shape of the diaphragm 5 can be set as a square of which one side is in the region of approximately 200 to 500 µm.

As the reference pressure chamber 10 is a component for maintaining a pressure that forms a reference for pressure measurement, it is desirable when acting as an absolute pressure sensor, which is a common application, that the inside of the reference pressure chamber 10 is, as far as possible, a high vacuum. In order to obtain the high vacuum reference pressure chamber 10, for example, the first silicon substrate 1 and the second silicon substrate 2 can be joined in a high vacuum chamber, whereby the interior of the reference pressure chamber 10 becomes a high vacuum.

Also, although an example wherein the oxide film 8 is provided on the one main face 1a side of the first silicon substrate 1, and the first silicon substrate 1 and the second silicon substrate 2 are joined across the oxide film 8, is shown in FIG. 1 and FIG. 2, the oxide film 8 need not necessarily be provided on the one main face 1a of the first silicon substrate 1. The substrates may be bonded together after the oxide film 8 is provided on a joint face side of the second silicon substrate 2. Alternatively, the substrates may be joined by being bonded together after the oxide film 8 is provided on both the first silicon substrate 1 and the second silicon substrate 2.

Also, the alignment mark 4 is formed in the one main face 1a of the first silicon substrate 1 in a region separated from the recessed portion 3 of a region covered by the second silicon substrate 2, that is, in a surface region in which the recessed portion 3 is not provided and which is not in contact with the recessed portion 3. The alignment mark 4 is depicted simplified in FIG. 2, and a specific form is not shown, but in actuality, a form, size, and quantity appropriate for recognition by a stepper used when carrying out a photoengraving process that forms the gauge resistor 6 or the like are provided. For example, a collection of microscopic rectangular patterns, formed by a large number of rectangular patterns of a size such that one side of each rectangular pattern is in the region of approximately 1 to 5 µm and a depth is in the region of approximately 1 to 2 µm being gathered, is used as the alignment mark 4 in one place.

A configuration is such that the diaphragm 5 bends in the semiconductor pressure sensor 100 when pressure is applied, and the gauge resistor 6 detects the distortion. As shown in FIG. 2, the gauge resistor 6 is formed in a portion practically aligned with an outer peripheral edge of the diaphragm 5. As a characteristic of the present application, a large number of the alignment mark 4 are disposed in not only the outer edge portion of the wafer but also in a central portion of the wafer in the plane of the wafer 101, and positioning can be carried out using alignment marks 4 near a processing target, because of which the gauge resistor 6 can be formed with high accuracy in a predetermined position in the diaphragm 5, without being affected by a wafer diameter or a warping.

Also, the alignment mark 4 is completely covered by the second silicon substrate 2, and is not exposed in an external portion, meaning that even when a foreign object such as a resist remains inside a recessed portion configuring the alignment mark 4, the foreign object does not protrude to an exterior, and generation of dust can be forestalled.

Figure 6:
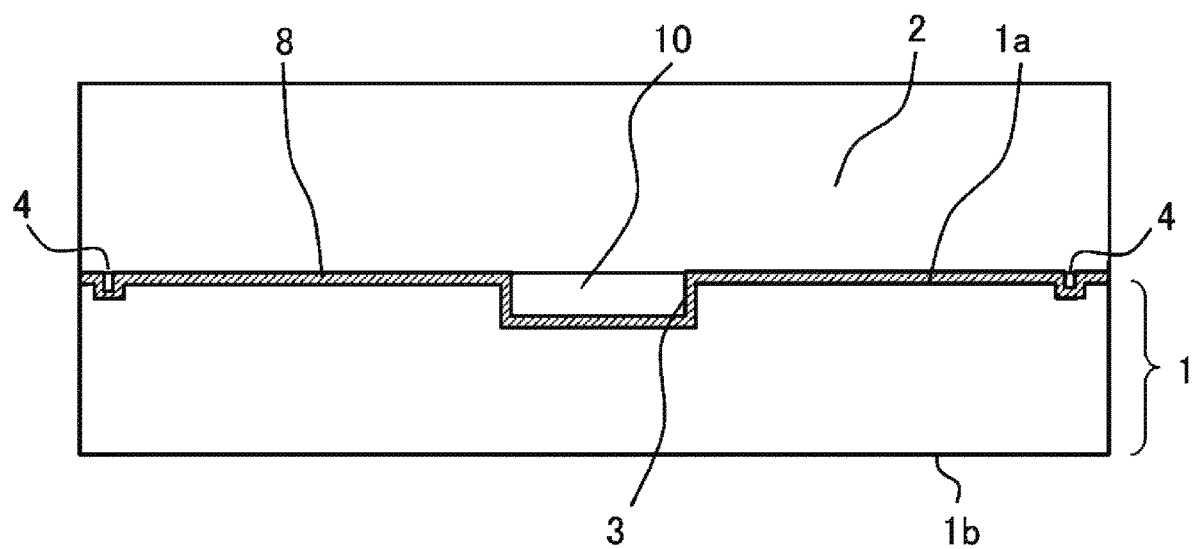
FIG. 6 is a drawing showing a manufacturing step of the semiconductor pressure sensor, and is a sectional view of when joining a first silicon substrate and a second silicon substrate.
Figure 7:
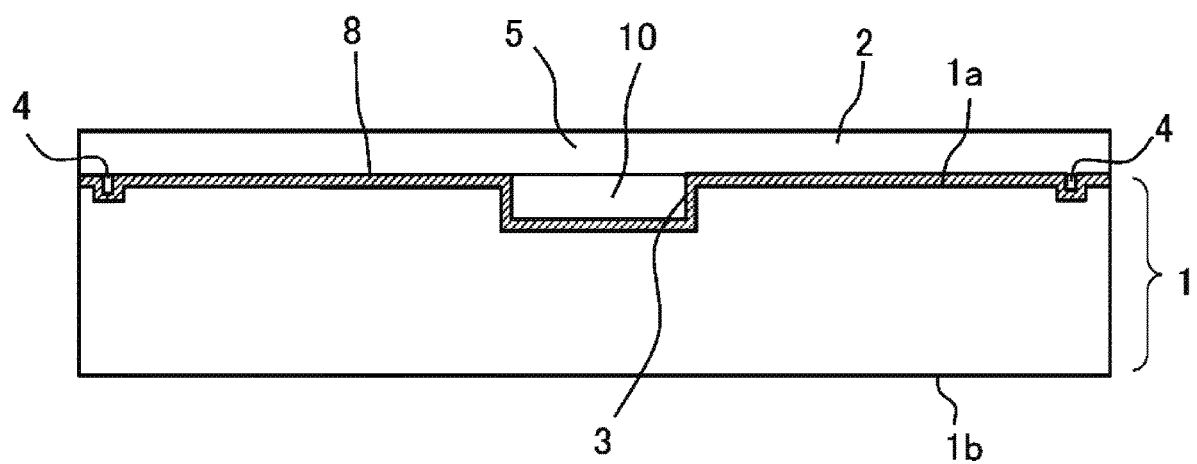
FIG. 7 is a drawing showing a manufacturing step of the semiconductor pressure sensor, and is a sectional view of when forming a diaphragm.

Next, a method of manufacturing the semiconductor pressure sensor 100 of the present application will be described, using the process drawings of FIG. 3 to FIG. 7. In order of semiconductor pressure sensor manufacturing step, FIG. 3 shows a sectional view of when forming the alignment mark 4, FIG. 4 shows a sectional view of when forming the recessed portion 3 that is to form the reference pressure chamber 10, FIG. 5 shows a sectional view of when forming the oxide film 8, FIG. 6 shows a sectional view of when joining the first silicon substrate 1 and the second silicon substrate 2, and FIG. 7 shows a sectional view of when forming the diaphragm 5.

Figure 3:
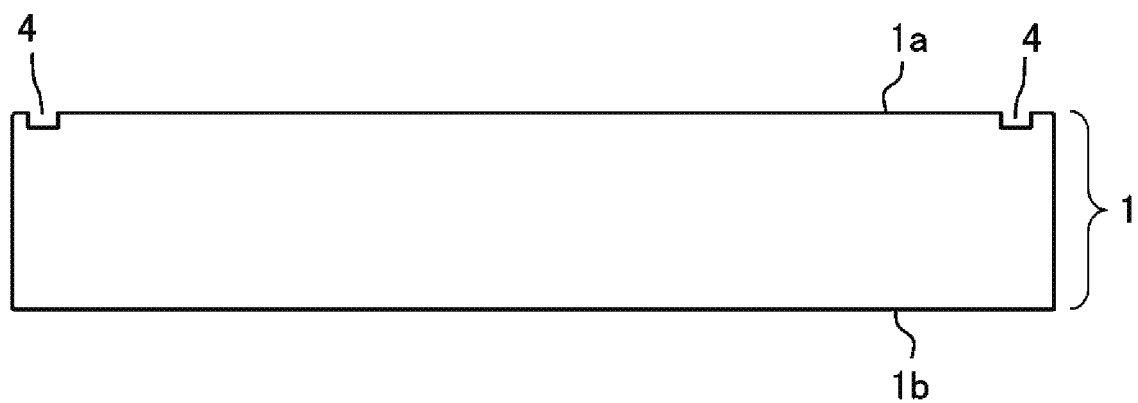
FIG. 3 is a drawing showing a manufacturing step of the semiconductor pressure sensor, and is a sectional view of when forming an alignment mark.

As shown in FIG. 3, the alignment mark 4, which is needed for positioning when forming pressure-sensitive element portions such as the recessed portion 3 and the gauge resistor 6 formed in subsequent steps, is formed in the one main face 1a of the first silicon substrate 1, which is in a wafer state. In order that a stepper can be used in a photoengraving step, the alignment mark 4 is provided in such a way as to be of a detectable form fixed in accordance with the stepper. As a method of forming the alignment mark 4, for example, the alignment mark 4 can be formed by etching the one main face 1a of the first silicon substrate 1 using a plasma etching device or the like. Herein, as it is sufficient that the alignment mark 4 can be recognized using a stepper, there is no need to etch more deeply than necessary, and it is sufficient that a depth of a recessed portion configuring the alignment mark 4 is in the region of approximately 1 to 2 µm.

Figure 4:
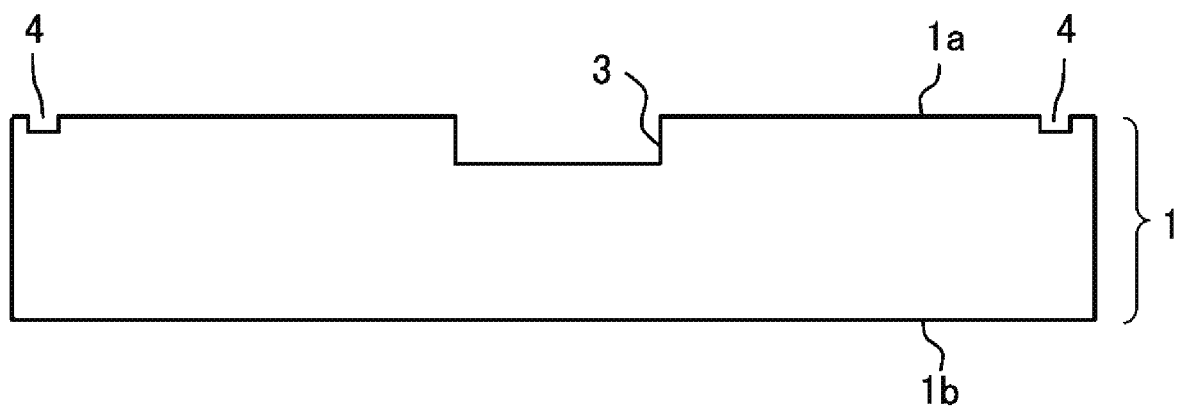
FIG. 4 is a drawing showing a manufacturing step of the semiconductor pressure sensor, and is a sectional view of when forming a recessed portion that becomes a reference pressure chamber.

Next, as shown in FIG. 4, positioning is carried out with the alignment mark 4 as a reference, and the recessed portion 3 is formed in the one main face 1a of the first silicon substrate 1. In a subsequent step, the recessed portion 3 becomes the reference pressure chamber 10 of a pressure sensor whose interior is maintained as a vacuum, and a depth to which the recessed portion 3 is gouged out from the one main face 1a can be arbitrarily set within a range of, for example, 50 to 300 µm. The less the gouging out of the recessed portion 3, the smaller the processing load, but the capacity of the reference pressure chamber 10 also decreases, because of which the depth of the recessed portion 3 is selected with consideration to a trade-off relationship with an increase in a pressure fluctuation, that is, an output fluctuation, caused by a microscopic leak. When the depth is 50 µm or greater, the gouging dimension of the recessed portion 3 is comparatively large, because of which a DRIE device that uses the Bosch process is commonly used when processing. However, processing using a plasma etching device can also be carried out, in the same way as when forming the alignment mark 4. A wet etching using an alkaline etching solution such as TMAH (tetramethylammonium hydroxide) can also be applied instead of a dry etching device such as a plasma etching device or a DRIE device.

Figure 5:
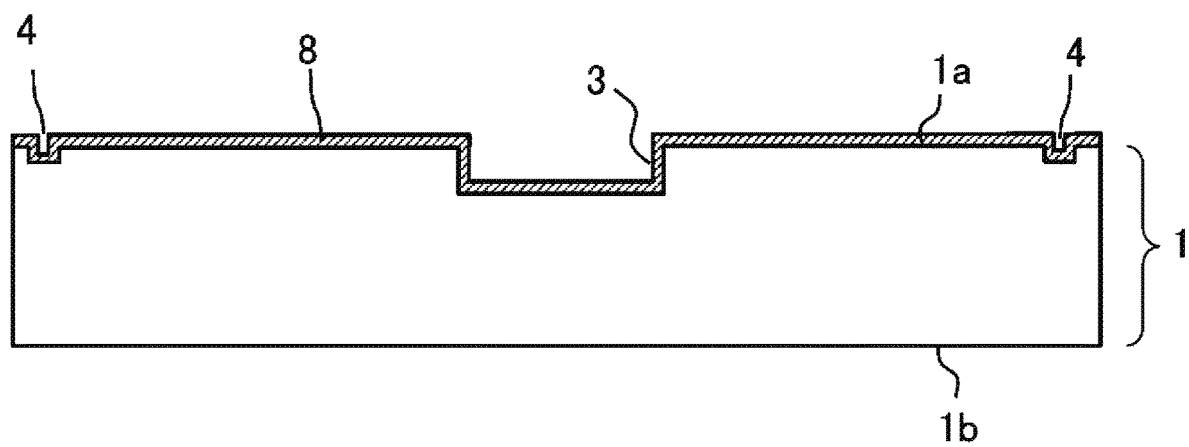
FIG. 5 is a drawing showing a manufacturing step of the semiconductor pressure sensor, and is a sectional view of when forming an oxide film.

After the recessed portion 3 is formed in this way, the first silicon substrate 1 is thermally oxidized, thereby forming the oxide film 8 over the whole of front and back faces of the wafer 101, as shown in FIG. 5. A preferred thickness of the oxide film 8 is in the region of approximately 0.2 to 1 µm. In order to simplify the description, a functionally irrelevant oxide film on a back face 1b side of the first silicon substrate 1 is not shown.

Next, as shown in FIG. 6, the second silicon substrate 2, which is prepared in advance, is superimposed on the one main face 1a side of the first silicon substrate 1, on which the recessed portion 3 is formed, and the first silicon substrate 1 and the second silicon substrate 2 are joined together by a vacuum being created, and thermal oxidation being carried out in an environment of approximately 1,100° C. By the first silicon substrate 1 and the second silicon substrate 2 being bonded together in the vacuum atmosphere, the reference pressure chamber 10 is completely hermetically sealed.

Next, as shown in FIG. 7, an exposed surface of the second silicon substrate 2 is thinned by being ground using a grinder or the like. Furthermore, polishing using CMP (chemical mechanical polishing) or the like is carried out in order to finish the surface of the second silicon substrate 2 to a mirror-like state. By so doing, the diaphragm 5 is completed.

Next, by positioning with respect to the alignment mark 4 using a stepper, pressure-sensitive element portions configuring the pressure detecting portion 20, such as the gauge resistor 6, are formed in predetermined positions in the diaphragm 5, whereby the semiconductor pressure sensor 100 shown in FIG. 2 can be obtained. As the alignment mark 4 is in a state completely covered by the second silicon substrate 2 when forming the pressure-sensitive element portions, the alignment mark 4 does not appear on either the front or back face. In the present application, therefore, detection of the alignment mark 4 is carried out using an infrared camera. As infrared rays penetrate a silicon substrate, the alignment mark 4 can be recognized from the second silicon substrate 2 side, even when the alignment mark 4 is in a state covered by the second silicon substrate 2. When forming the gauge resistor 6, processing can be carried out accurately by the alignment mark 4 near a processing target region detected using an infrared sensor being used for positioning.

Subsequently, a protective film 7 is formed on the surface of the second silicon substrate 2, protecting the pressure detecting unit 20 such as the gauge resistor 6, whereby the semiconductor pressure sensor 100 shown in FIG. 2 can be obtained. Herein, a moisture-resistant nitride film having a thickness of in the region of approximately 1 μm can be used as the protective film 7.

As the semiconductor pressure sensor 100 of FIG. 1 and FIG. 2 is in a state incorporated in the wafer 101 before dicing, the semiconductor pressure sensor 100 can subsequently be processed into an individual chip by being severed along a dicing line portion 9 (shown in FIG. 8, to be described hereafter) in such a way as to have the dimensions of each semiconductor pressure sensor 100.

Herein, a description will be given of a case wherein the alignment mark 4 used in positioning in a product manufacturing process remains in the product even after dicing. The alignment mark 4 is in a state of remaining sealed in the product, without being exposed to the exterior, between the first silicon substrate 1 and the second silicon substrate 2, but provided that the alignment mark 4 and the recessed portion 3 are separated, and no leak path is formed, there is no effect on a pressure detecting performance.

An existing semiconductor pressure sensor is such that an alignment mark that fulfills a reference position function is provided only in a stepped portion on an outer peripheral edge of a wafer, because of which positional accuracy of a gauge resistor with respect to a diaphragm decreases together with an increase in a wafer diameter, and a pressure detecting accuracy of the product itself decreases. By employing the configuration of the semiconductor pressure sensor 100 of the present application, however, a region in which the alignment mark 4 can be disposed can be extended to practically the whole of the wafer 101. That is, a configuration is such that the alignment mark 4 is formed in a region separated from the recessed portion 3 of a region of the one main face 1a of the first silicon substrate 1 to which the second silicon substrate 2 is bonded, whereby tolerance when forming the alignment mark 4 can be considerably increased. As a result, the alignment mark 4 can be provided in a vicinity of the pressure detecting portion 20, which is a positioning target, because of which the recessed portion 3 is correctly positioned with respect to the alignment mark 4 and accurately formed, even when being in the central portion of the wafer 101, and furthermore, the gauge resistor 6 can be formed in an appropriate position with respect to the diaphragm 5, and accuracy of the completed product, and reliability of pressure measurement, which is a basic function, can be increased.

Also, a position and a structure of the stepped portion 12 of the wafer 101 are such that the stepped portion 12 is inherently a region in which a resist used in a photoengraving process is liable to be applied thickly. Because of this, the resist is liable to remain in the interior of the alignment mark 4 provided in the stepped portion 12, becoming a cause of contamination of a manufacturing device used in a subsequent step. In the present application, however, the alignment mark 4 can be provided toward an interior of the wafer 101, because of which alignment marks 4 disposed in the outer edge portion of the wafer 101 can be reduced in number or eliminated, contamination caused by a foreign object remaining inside the recessed portion of the alignment mark 4 can be restricted, and manufacturing stability can be increased.

In this way, the disposition of the alignment mark 4 is reviewed in the present application, a configuration wherein the alignment mark 4 can be disposed in a region other than the recessed portion 3 of the first silicon substrate 1 covered by the second silicon substrate 2 is adopted in order that the alignment mark 4 is provided mainly toward the interior of the wafer 101, and tolerance when forming the alignment mark 4 is increased. Because of this, the alignment mark 4 can be formed in appropriate positions with respect to all semiconductor pressure sensors 100 in the wafer 101, highly accurate positioning can be carried out, accuracy when completing the semiconductor pressure sensor 100 itself can be increased, and a high reliability can be obtained.

Second Embodiment

Next, the semiconductor pressure sensor 100 according to a second embodiment of the present application will be described, using FIG. 8.

As shown in the first embodiment, the alignment mark 4 is formed in a region of the one main face 1a of the first silicon substrate 1 that is joined to the second silicon substrate 2, because of which the alignment mark 4 is completely covered by the second silicon substrate 2. However, the shallow recessed portion configuring the alignment mark 4 is in a state of remaining as a microscopic gap in an interface between the substrates. As the alignment mark 4 is actually a collection of a large number of microscopic patterns, these is a risk of microscopic patterns connecting with each other, and depending on the disposition of the alignment mark 4, there is also a risk of causing a leak path to be formed between the reference pressure chamber 10 and the exterior.

In the second embodiment, therefore, a description will be given of a case wherein the alignment mark 4 is selectively disposed in the dicing line portion 9 of the first silicon substrate 1 (the wafer 101), and the alignment mark 4 is removed by a dicing that cuts a chip away from the wafer 101.

Figure 8:
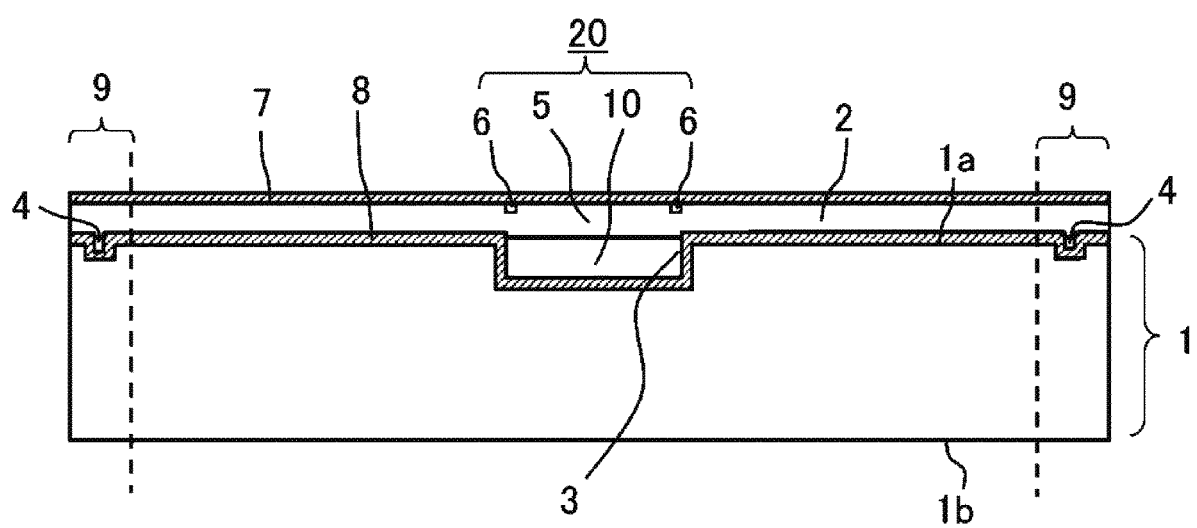
FIG. 8 is a sectional view showing a semiconductor pressure sensor according to a second embodiment.

As shown in FIG. 8, the alignment mark 4 is provided, for example, in a dicing line portion positioned in an intermediate region between two neighboring pressure detecting portions 20 among pressure detecting portions 20 disposed in a matrix in one wafer 101, and the alignment mark 4 remains in the dicing line portion 9 at a stage at which the semiconductor pressure sensor 100 is completed on the wafer 101. When dividing into individual chips by removing the dicing line portion 9 by dicing, the alignment mark 4 can be eliminated from the completed chip. Alternatively, even when not all of the alignment marks 4 can be removed, the number of alignment marks 4 can be considerably reduced by removing the dicing line portion 9.

By the alignment mark 4 being disposed in the dicing line portion 9, irregularities can be eliminated from the interface between the first silicon substrate 1 and the second silicon substrate 2 in a product formed into a chip, because of which joint strength is increased, and by extension, product reliability can be increased. Furthermore, as the alignment mark 4 is eliminated from inside the chip, the risk of a leak path being formed decreases sharply, and an advantage in that airtightness reliability increases can be obtained. In this way, according to the semiconductor pressure sensor 100 of the second embodiment, risk caused by the alignment mark 4 remaining inside the product can be considerably reduced.

Although the present application is described in terms of various exemplary embodiments and implementations, it should be understood that the various features, aspects, and functions described in one or more of the individual embodiments are not limited in their applicability to the particular embodiment, but instead can be applied, alone or in various combinations, to one or more of the embodiments.

It is therefore understood that numerous modifications which have not been exemplified can be devised without departing from the scope of the present application. For example, at least one of the constituent components may be modified, added, or eliminated. At least one of the constituent component may be selected and combined with the constituent components mentioned in another preferred embodiment.

REFERENCE SIGNS LIST

1 first substrate, 1*a* one main face, 1*b* back face, 2 second silicon substrate, 3 recessed portion, 4 alignment mark, 5 diaphragm, 6 gauge resistor, 7 protective film, 8 oxide film, 9 dicing line portion, 10 reference pressure chamber, 12 stepped portion, 20 pressure detecting portion, 100 semiconductor pressure sensor, 101 wafer

The invention claimed is:

1. A semiconductor pressure sensor manufacturing method, comprising:

a step of forming a recessed portion, which becomes a reference pressure chamber, and an alignment mark in one main face of a first silicon substrate;

a step of joining a second silicon substrate to the one main face of the first silicon substrate, and covering the recessed portion and the alignment mark with the second silicon substrate;

a step of forming a diaphragm in the second silicon substrate;

a step of detecting the alignment mark using an infrared camera, and forming a pressure-sensitive element portion in the second silicon substrate after positioning using the alignment mark; and a step of cutting, with pressure detecting portions including the diaphragm and the pressure-sensitive element portion being disposed in a matrix in one wafer configuring the first silicon substrate, and the alignment mark being disposed in a dicing line portion positioned between neighboring pressure detecting portions, the wafer along the dicing line portion, thereby cutting individual pressure detecting portions away from the wafer.

* * * * *